United States Patent

Nishiyama

[11] Patent Number: 6,107,685
[45] Date of Patent: Aug. 22, 2000

[54] SEMICONDUCTOR PART AND FABRICATION METHOD THEREOF, AND STRUCTURE AND METHOD FOR MOUNTING SEMICONDUCTOR PART

[75] Inventor: Kazuo Nishiyama, Kanagawa, Japan

[73] Assignee: Sony Corporation, Tokyo, Japan

[21] Appl. No.: 09/398,762

[22] Filed: Sep. 17, 1999

[30] Foreign Application Priority Data

Sep. 25, 1998 [JP] Japan .................................. 10-271739

[51] Int. Cl.[7] .................................................. H01L 23/48
[52] U.S. Cl. .......................... 257/737; 257/738; 257/778; 257/786
[58] Field of Search ................................... 257/786, 778, 257/737, 738

[56] References Cited

U.S. PATENT DOCUMENTS

| | | | |
|---|---|---|---|
| 5,686,699 | 11/1997 | Chu et al. ................................. | 257/776 |
| 5,828,128 | 10/1998 | Higashiguchi et al. ................ | 257/738 |
| 5,874,776 | 2/1999 | Kresge et al. .......................... | 257/747 |
| 5,977,617 | 11/1999 | Kata ........................................ | 257/668 |

*Primary Examiner*—David Hardy
*Assistant Examiner*—Lourdes Cruz
*Attorney, Agent, or Firm*—Hill & Simpson

[57] ABSTRACT

Disclosed is a semiconductor part improved to enhance the connection strength of land terminals upon mounting of the semiconductor part and to give a sufficient margin to the arrangement pitch of wires passing through the land terminals, a fabrication method thereof, and a structure and method of mounting the semiconductor part. The semiconductor part includes land terminals for bumps (or land terminals provided with bumps), arranged in a grid pattern, which are connected to surfaces of electrode pads via re-arrangement wires on a base; wherein the land terminals for bumps (or land terminals provided with bumps) are classified into outer land terminals arranged on the outer peripheral side of the base and inner land terminals arranged inside the outer land terminals; and the outer land terminals each have a diameter larger than that of each of the inner land terminals and/or have a pitch larger than an arrangement pitch of the inner land terminals.

12 Claims, 6 Drawing Sheets

OUTERMOST (PITCH:0.8mm) →
INTERMEDIATE (PITCH:0.65mm) →
INNERMOST (PITCH:0.5mm, 2 ROWS)

RE-ARRANGEMENT WIRES

MASK ALIGNMENT FOR PRINTING

TRANSFER OF SOLDER

WET-BACK (FORMATION OF BUMPS)

SEMICONDUCTOR PART AND FABRICATION METHOD THEREOF, AND STRUCTURE AND METHOD FOR MOUNTING SEMICONDUCTOR PART

RELATED APPLICATION DATA

The present application claims priority to Japanese Application No. P10-271739 filed Sep. 25, 1998 which application is incorporated herein by reference to the extent permitted by law.

BACKGROUND OF THE INVENTION

The present invention relates to a semiconductor part and a fabrication method thereof, and a structure and a method for mounting the semiconductor part.

With the strong demands toward miniaturization, thinning and lightweightness of electronic equipment represented by digital video cameras, digital portable telephones and note-type personal computers, it has become important for study and development of the electronic equipment how to improve surface mounting density of semiconductor parts used for the electronic equipment.

To improve the surface mounting density of semiconductor parts, a smaller CSP (Chip Scale Package) technique has been developed in place of the package IC mounting technique, for example, QFP (Quad Flat Package) and partially come into practical use; and further, in order to realize the ultimate semiconductor high density mounting, the widespread use of a mounting technique (connection technique) such as a flip-chip type bare mounting technique has been strongly required.

In the conventional flip-chip type bare mounting technique, bumps have been formed on the surfaces of Al electrode pads on a chip; however, in recent years, a technique for simplifying the mounting of a chip has been popularized in which land terminals, often called connection terminals, are formed on a chip via re-arrangement wires in such a manner that the land terminals are arranged with a broaden pitch. It should be noted that the land terminals, which are arranged in a grid pattern, are also called area terminals.

On the other hand, the number of connection terminals (IC pins) increases even more along with the trend toward a higher level of integration and multi-functions of semiconductor LSIs.

To achieve high density mounting of such semiconductor LSIs with the increased number of pins, it is required to make finer arrangement pitch of land terminals.

Table 1 shows one example of a load map of a semiconductor technique advanced along with the trend toward finer-geometries of semiconductor LSIs. As is apparent from Table 1, with the trend toward finer-geometries, higher level of integration, and advanced systemization of semiconductor LSIs, the number of pins is significantly increased, and correspondingly the arrangement pitch of electrodes and also the arrangement pitch of land terminals provided for flip-chip mounting are made significantly finer.

TABLE 1

| design rule | number of connection pins (unspecified) | pitch of Al electrodes | pitch of land terminals for flip-chip |
|---|---|---|---|
| 1997 | 0.25 μm | 100–295 | 80 μm | 500 μm |
| 1999 | 0.18 μm | 117–400 | 70 μm | 400 μm |
| 2001 | 0.15 μm | 137–469 | 60 μm | 400 μm |
| 2003 | 0.13 μm | 161–551 | 50 μm | 300 μm |
| 2006 | 0.10 μm | 205–699 | 50 μm | 300 μm |

However, as the arrangement pitch of land terminals provided for a semiconductor chip becomes finer, the diameter of the terminals is of course required to be made smaller, thereby giving rise to a problem that the connection strength is degraded upon mounting of the semiconductor chip on a circuit board.

The above problem will be described in detail with reference to FIGS. 6A to 6D and FIGS. 7A and 7B.

FIGS. 6A to 6D show a related art flip-chip mounting steps using bumps. At the step shown in FIG. 6A, bumps 6 made from solder are formed on land terminals 6a via re-arrangement wires made from a BLM (Ball Limiting Metal) film 4 connected to the surfaces of Al electrode pads 2 provided on a Si wafer 1. Reference numeral 3 designates a passivation film formed of a $Si_3N_4$ film and a polyimide film, and 5 designates a polyimide film for protecting the uppermost surface and imparting wettability to the surfaces of the bumps.

The Si wafer 1 is then diced into Si chips 7, and at the step shown in FIG. 6B, each chip 7 is mounted as a flip-chip on a circuit board 8. Reference numeral 9 designates electrodes on the circuit board side, to which the bumps 6 are to be connected; 10 is a solder paste; and 11 is a solder resist.

Next, examination will be made of a resistance against thermal stress applied between the circuit board 8 made from typically glass reinforced epoxy resin and the Si chip 7 mounted thereon. The thermal expansion coefficient ($\alpha$) of the Si chip is as small as 3.4 ppm/° C. while the thermal expansion coefficient ($\alpha$) of the circuit board 8 is as large as 14 to 16 ppm/° C. Accordingly, a difference in thermal expansion coefficient between the Si chip 7 and the circuit board 8 becomes 11 to 12 ppm/° C.

Assuming that the temperature difference of the Si chip 7 between turn-on and turn-off of a power source is 100° C. and the chip size is 10 mm×10 mm, a displacement of the bump 6 disposed at the outermost peripheral portion of the surface of the Si chip 7 due to the thermal expansion becomes 8 μm, and after repetition of the ON/OFF operations, a crack 12 appears in the bump 6, particularly, at the root portion of the bump 6 as shown FIG. 6C. The crack 12 leads to a connection failure, which may eventually cause breakage of the bump 6. Such a phenomenon is prone to occur at those of the connection terminals closer to the outer periphery of the Si chip or smaller in diameter. To cope with such a problem, there has been adopted a method of filling a space between the Si chip 7 and the circuit board 9 with a resin 13 and curing it, thereby absorbing and relieving stress applied to the bumps 6 due to the thermal expansion; however, such a method is not necessarily best.

On the other hand, as the land terminals of the Si chip become finer, the wiring density of the circuit board on which the Si chip is to be mounted becomes significantly larger, to thereby raise the production cost of the circuit board.

FIG. 7A shows land terminals 15 (each having the same diameter) arranged with a pitch of 0.8 mm and re-arrangement wires 17 for connecting Al electrode pads to the land terminals 15 or re-arrangement wires 17 on the circuit board side, and FIG. 7B shows land terminals 16 (each having the same diameter) arranged with a pitch of 0.5 mm and re-arrangement wires 18 for connecting Al electrode pads to the land terminals 16 or re-arrangement wires 18 on the circuit board side. As is apparent from FIGS. 7A and 7B, the number of the wires laid out between the land terminals 15a (or 16a) disposed on the outermost peripheral side is larger than that of the wires laid out between the land terminals, for example, 15b (or 16b) disposed inwardly therefrom because the wires connected to the land terminals 15b (or 16B) disposed just inwardly from the land terminals 15a (or 16a) additionally pass between the land terminals 15a (or 16a).

Assuming that the diameter of the land terminals arranged with the pitch of 0.8 mm as shown in FIG. 7A is taken as 0.4 mm, a gap between the land terminals 15a disposed on the outermost peripheral side is 0.4 mm, and in this case, six wires must pass through the gap, with a result that the L/S (Line & Space) of each wire becomes 30.8 $\mu$m (pitch of the wires is 61.5 $\mu$m).

On the contrary, for the array of the land terminals 16a with the pitch of 0.5 mm as shown in FIG. 7B, the diameter of the terminals is reduced to 0.25 mm and the L/S of the wires passing between the terminals 16a becomes as fine as 19.2 $\mu$m (pitch of the wires is 38.5 $\mu$m).

As the wires become fine as described above, it becomes very difficult to process the circuit board. As a result, there occurs an inconvenience that the circuit board must be configured, for example, as a multi-layer circuit board produced by a build-up method, resulting in the raised cost.

SUMMARY OF THE INVENTION

A first object of the present invention is to provide a semiconductor part improved to enhance the connection strength of land terminals upon mounting of the semiconductor part and to give a sufficient margin to the arrangement pitch of wires passing through the land terminals, in consideration of the recent trend toward a finer pitch of the land terminals and a larger number of pins.

A second object of the present invention is to provide a method of fabricating the above-described semiconductor part.

A third object of the present invention is to provide a structure for mounting the above-described semiconductor part.

A fourth object of the present invention is to provide a method of mounting the above-described semiconductor part.

To achieve the first object, according to the present invention, there is provided a semiconductor part including:
  land terminals for bumps (or land terminals provided with bumps), arranged in a grid pattern, which are connected to surfaces of electrode pads via re-arrangement wires on a base;
  wherein the land terminals for bumps (or land terminals provided with bumps) are classified into outer land terminals arranged on the outer peripheral side of the base and inner land terminals arranged inside the outer land terminals; and
  the outer land terminals each have a diameter larger than that of each of the inner land terminals and/or have a pitch larger than an arrangement pitch of the inner land terminals.

To achieve the second object, according to the present invention, there is provided a method of fabricating a semiconductor part in which land terminals provided with bumps, arranged in a grid pattern, are connected to surfaces of electrode pads via re-arrangement wires on a base, wherein the land terminals provided with bumps are classified into outer land terminals provided with bumps, which are arranged on the outer peripheral side of the base, and inner land terminals provided with bumps, which are arranged inside the outer land terminals provided with bumps, and the outer land terminals provided with bumps each have a diameter larger than that of each of the inner land terminals provided with bumps and/or have a pitch larger than an arrangement pitch of the inner land terminals provided with bumps,
  the method including the steps of:
    forming the land terminals for bumps on the base in such a manner that the land terminals are connected to the surfaces of the electrode pads via the re-arrangement wires;
    supplying a conductive bump material on the land terminals for bumps using a mask having a controlled mask opening diameter in accordance with a film formation method represented by a printing method or a coating method, or a vapor-deposition method or a plating method; and
    fusing the conductive bump material thus supplied to form the bumps.

To achieve the second object, according to the present invention, there is also provided a method of fabricating a semiconductor part in which land terminals provided with bumps, arranged in a grid pattern, are connected to surfaces of electrode pads via re-arrangement wires on a chip, wherein the land terminals provided with bumps are classified into outer land terminals provided with bumps, which are arranged on the outer peripheral side of the chip, and inner land terminals provided with bumps, which are arranged inside the outer land terminals provided with bumps, and the outer land terminals provided with bumps each have a diameter larger than that of each of the inner land terminals provided with bumps and/or have a pitch larger than an arrangement pitch of the inner land terminals provided with bumps,
  the method including the steps of:
    forming land terminals for bumps on a wafer in such a manner that the land terminals are connected to the surfaces of the electrode pads via the re-arrangement wires;
    supplying a conductive bump material on the land terminals for bumps using a mask having a controlled mask opening diameter in accordance with a film formation method represented by a printing method or a coating method, or a vapor-deposition method or a plating method; and
    fusing the conductive bump material thus supplied to form the bumps;
    wherein the steps are performed as part of a series of wafer processing steps, and the wafer thus processed is diced into chips.

To achieve the third object, according to the present invention, there is provided a structure for mounting a semiconductor part, including:
  land terminals provided with bumps, arranged in a grid pattern, which are connected to the surfaces of electrode pads via re-arrangement wires on a base of the semiconductor part, wherein the land terminals provided with bumps are classified into outer land terminals provided with bumps, which are arranged on the outer peripheral side of the base and inner land terminals provided with bumps, which are arranged inside the outer land terminals, and the outer land terminals provided with bumps each have a diameter larger than that of each of the inner land terminals provided with bumps and/or have a pitch larger than an arrangement pitch of the inner land terminals provided with bumps; and land terminals formed on a circuit board;

wherein the land terminal provided with bumps on the semiconductor part side are connected to the land terminals on the circuit board side via the bumps.

To achieve the fourth object, according to the present invention, there is provided a method of mounting a semiconductor part on a circuit board, the semiconductor part being configured such that land terminals provided with bumps, arranged in a grid pattern, are connected to surfaces of electrode pads via re-arrangement wires on a chip, wherein the land terminals provided with bumps are classified into outer land terminals provided with bumps, which are arranged on the outer peripheral side of the base, and inner land terminals provided with bumps, which are arranged inside the outer land terminals provided with bumps, and the outer land terminals provided with bumps each have a diameter larger than that of each of the inner land terminals provided with bumps and/or have a pitch larger than an arrangement pitch of the inner land terminals provided with bumps, the circuit board being configured such that land terminals arranged in a grid pattern are connected to the surfaces of electrode pads via re-arrangement wires on a base, wherein the land terminals are classified into outer land terminals arranged on the outer peripheral side of the base and inner land terminals arranged inside the outer land terminals, and the outer land terminals each have a diameter larger than that of each of the inner land terminals and/or have a pitch larger than an arrangement pitch of the inner land terminals, the method including the steps of:

connecting the semiconductor part on the circuit board while aligning the land terminals provided with bumps on the semiconductor part side with the land terminals on the circuit board side.

As described above, one of the important improvements of the present invention is to provide a semiconductor part including land terminals provided with bumps, arranged in a grid pattern, which are connected to surfaces of electrode pads via re-arrangement wires on a base; wherein the land terminals provided with bumps are classified into outer land terminals arranged on the outer peripheral side of the base and inner land terminals arranged inside the outer land terminals; and the outer land terminals each have a diameter larger than that of each of the inner land terminals and/or have a pitch larger than an arrangement pitch of the inner land terminals.

The semiconductor part in the form of a wafer or a chip having the above structure is mounted on, that is, connected to a circuit board via the bumps in such a manner as to be aligned with the circuit board. The circuit board also has the surface layer structure corresponding to that of the semiconductor part. To be more specific, the land terminals on the circuit board side, on which the land terminals provided with bumps on the semiconductor part side are to be connected, are arranged on the circuit board with the pitch and diameter thereof matched with those of the land terminals provided with bumps on the semiconductor part side.

According to the present invention, land terminals with no bumps, arranged in a grid pattern, may be provided on the base of a semiconductor part. Even in this case, the pitch and/or diameter of the land terminals must satisfy the above-described specific requirement of the present invention. The land terminal with no bumps on the semiconductor part side can be connected to the land terminals on a circuit board side via a conductive adhesive such as solder.

In accordance with the semiconductor part of the present invention, since each of those of the land terminals disposed on the outermost peripheral side of the base, to which thermal stress is most applied, has a large diameter, it has a larger surface connected to the associated one of the bumps, and therefore, it exhibits a large connection strength to the circuit board. As a result, upon not only mounting but also operation of the semiconductor part, there is only a significantly small possibility of occurrence of an inconvenience such as a connection failure or cracking of bumps. The structure of mounting the semiconductor part according to the present invention, therefore, exhibits advantages that the physical strength is high, the durability is desirable, and the service life is long.

According to the present invention, since the outer land terminals disposed on the outer peripheral side of the base are arranged with a pitch larger than an arrangement pitch of the inner land terminals disposed on the inner peripheral side, it is possible to give a sufficient margin to the arrangement pitch of wires passing through adjacent ones of the outer land terminals, and hence to simplify the processing works for both the semiconductor part and the circuit board.

Since the inner land terminals are arranged with a pitch smaller than the outer land terminals (particularly, the pitch of the land terminals becomes stepwise or continuously small in the direction from the outer peripheral side to the inner peripheral side), the semiconductor part of the present invention can sufficiently keep up with the recent trend toward a finer diameter of the land terminals and a larger number of pins.

The semiconductor part with bumps having the above advantages may be fabricated by a manner of forming land terminals on a base in such a manner that the land terminals are connected to the surfaces of electrode pads via re-arrangement wires in accordance with a specific method, and supplying a conductive bump material such as solder on the land terminals by a printing method, a coating method, a vapor-deposition method, or a plating method. In this case, it may be desirable to control the supplied amount of the conductive bump material through a screen mask having a controlled opening diameter. The conductive bump material thus supplied is then subjected to wet-back, that is, heating and fusion, to be finally formed into bumps.

According to the present invention, it is essential that the heights formed on the land terminals are equal to each other. The heights of the bumps may be adjusted on the basis of the amount of the conductive bump material supplied through the mask and the areas of the land terminals which become the wet surfaces on which the bumps are to be formed. The semiconductor part of the present invention may be in the form of either a wafer or a chip irrespective of the presence or absence of the bumps; however, if it is required to form the land terminals provided with bumps on the semiconductor part, then it may be desirable in terms of production efficiency to incorporate the above bump formation steps in a series of wafer processing steps (formation of electrodes, layout of re-arrangement wires, and other processing steps such as epitaxy, oxidation, diffusion and vapor-deposition); collectively carry out these steps; and dice the wafer into chips.

DETAILED DESCRIPTION OF THE PREFERRED EMBODIMENTS

Figure 1A:
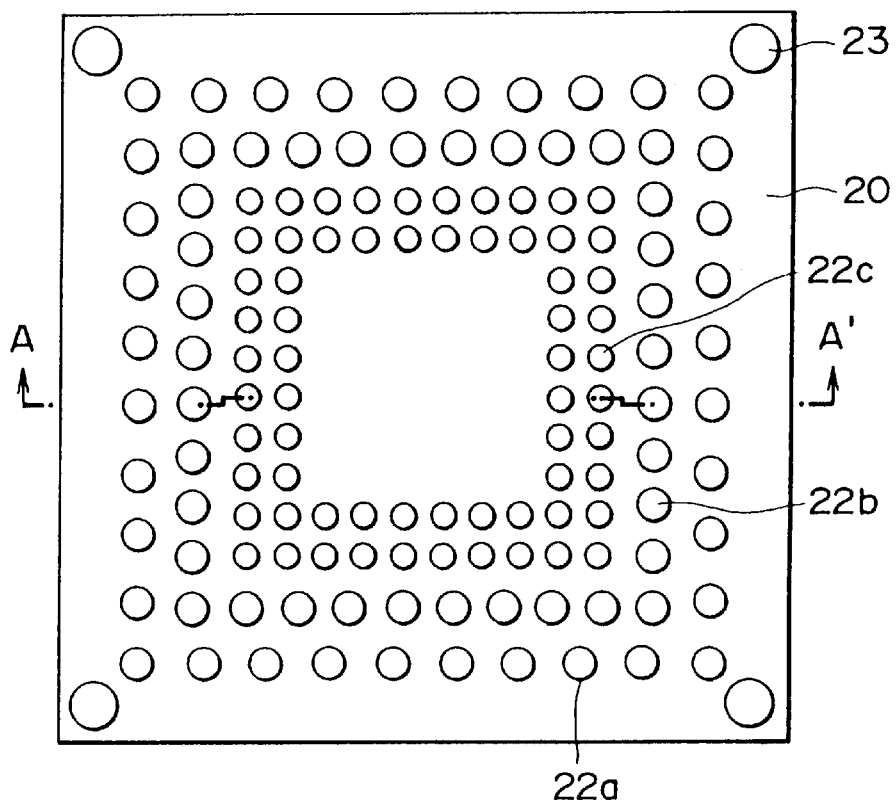
FIG. 1A is a view showing the surface configuration of a semiconductor part according to one embodiment of the present invention.
Figure 1B:
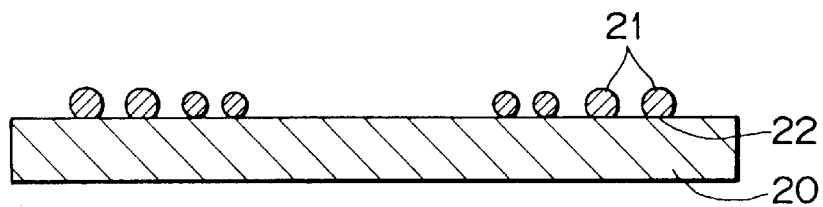
FIG. 1B is a sectional view taken on line A—A of FIG. 1A.

Hereinafter, the present invention will be described in detail with reference to preferred embodiments. FIGS. 1A and 1B show a semiconductor part according to one embodiment of the present invention, in which a plurality of land terminals 22 provided with bumps 21 are arranged on the surface of an LSI chip 20. It should be noted that in this figure, re-arrangement wires and the like are not shown.

A group of the land terminals 22 provided with bumps 21 are classified into large-diameter land terminals 22a with bumps arranged in one row with a pitch of 0.8 mm on the outermost peripheral side of the surface of the LSI chip 20; intermediate-diameter land terminals 22b with bumps arranged in one row with a pitch of 0.65 mm inwardly from the large-diameter land terminals 22a with bumps; and small-diameter land terminals 22c with bumps arranged in two rows with a pitch of 0.5 mm inwardly from the intermediate-diameter land terminals 22b with bumps. The total number of the terminals or pins is 136. On the contrary, if land terminals with bumps, each having the same diameter, are arranged in four rows with a pitch of 0.8 mm, the total number of the pins is as very small as 96. In FIG. 1A, reference numeral 23 designate reinforcing bumps provided at four corners of the surface of the LSI chip 20.

Figure 2A:
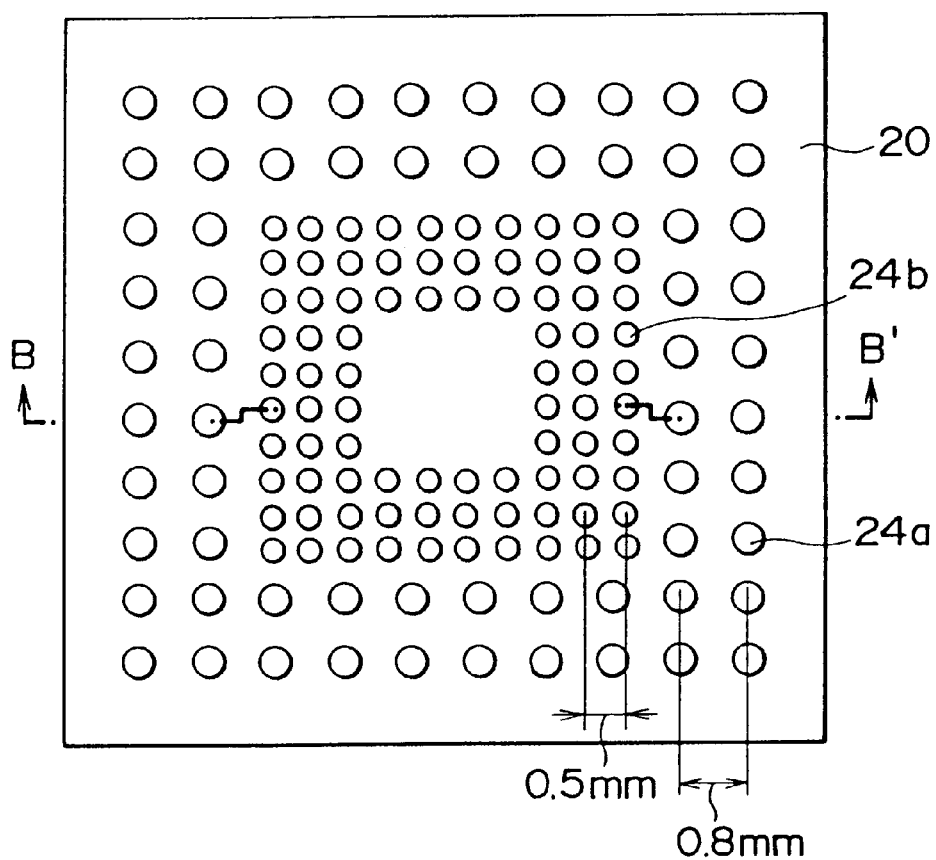
FIG. 2A is a view showing the surface configuration of a semiconductor part according to another embodiment of the present invention.
Figure 2B:
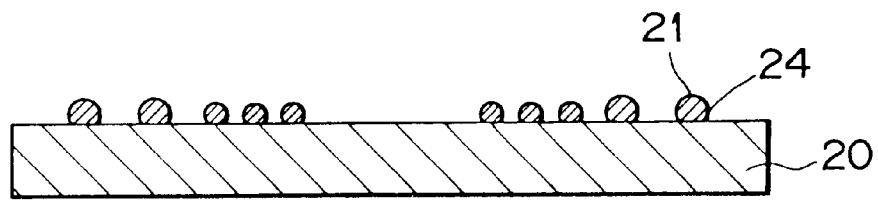
FIG. 2B is a sectional view taken on line B—B of FIG. 2A.

FIGS. 2A and 2B show another embodiment of the present invention, in which intermediate-diameter land terminals 24a with bumps on the outer peripheral side are arranged in two rows with a pitch of 0.8 mm and small-diameter land terminals 24b with bumps are arranged in three rows with a pitch of 0.5 mm inwardly from the land terminals 24a. In the above embodiments, which are different from each other in terms of the arrangement pitch of the land terminals with bumps, it is extremely important to make the heights of the bumps equal to each other.

FIGS. 3A to 3D show steps of forming land terminals with bumps in such a manner that the heights of bumps are equal to each other. At the step shown in FIG. 3A, land terminals 28 connected to Al electrode pads 26 via re-arrangement wires 27 are formed on a chip (or wafer) 25 in such a manner as to satisfy the specific requirement of the present invention associated with of the pitch and diameter of the land terminals. At the step shown in FIG. 3B, solder is supplied to the land terminals 28 on the chip 25 through a screen mask 29 in accordance with a printing method, to form bumps on the land terminals 28.

The screen mask 29 has a plurality of openings 29a for supplying solder to the land terminals 28 on the chip 25. To supply a suitable amount of solder through each opening 29a of the screen mask 29, the opening diameter of the opening 29a is designed to be controlled. In this case, the height of the bump formed on the land terminal 28 is determined on the basis of the surface area of the land terminal 28 and the supplied amount of solder.

Figure 3A:
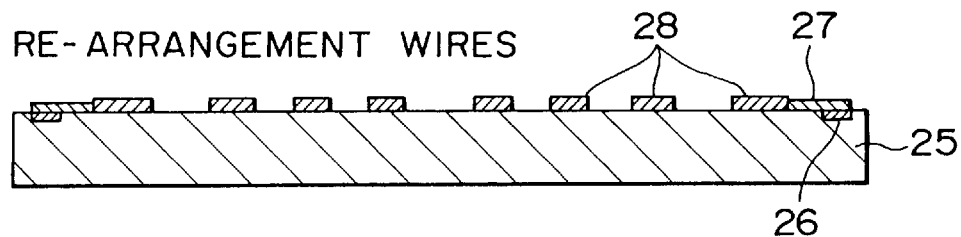
FIGS. 3A to 3D are views showing steps of forming the land terminals with bumps shown in FIGS. 1A and 1B or FIGS. 2A and 2B in such a manner that the heights of bumps are equal to each other.
Figure 3B:
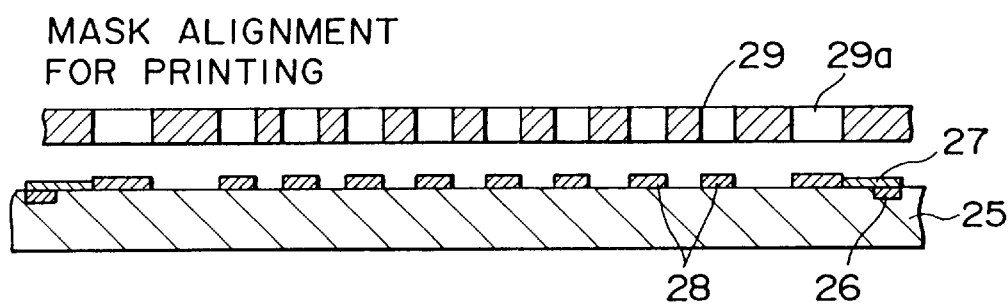
Figure 3C:
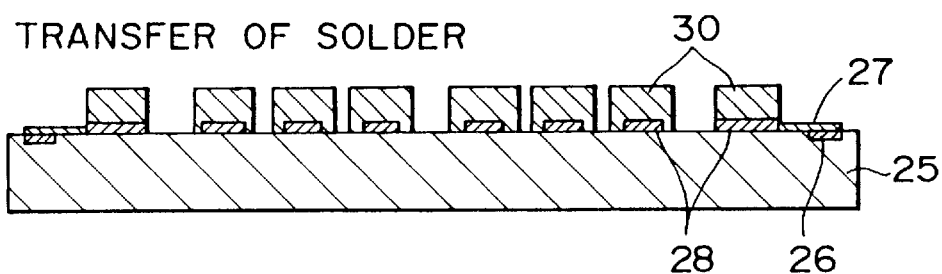
Figure 3D:
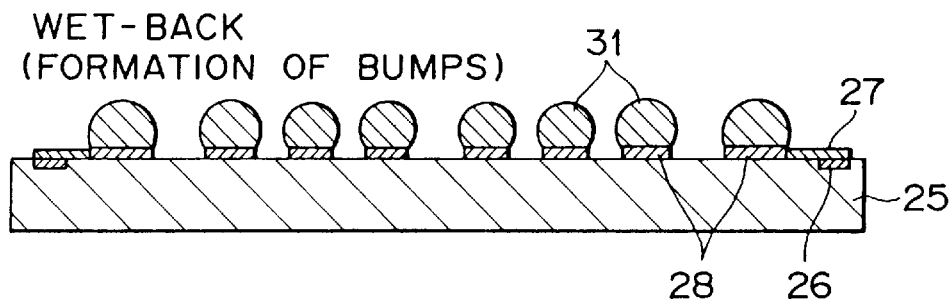

After supply of the solder 30 on the land terminals 28 as shown in FIG. 3C, at the step shown in FIG. 3D, the solder is subjected to wet-back, that is, fusion, to form bumps 31.

Figure 4:
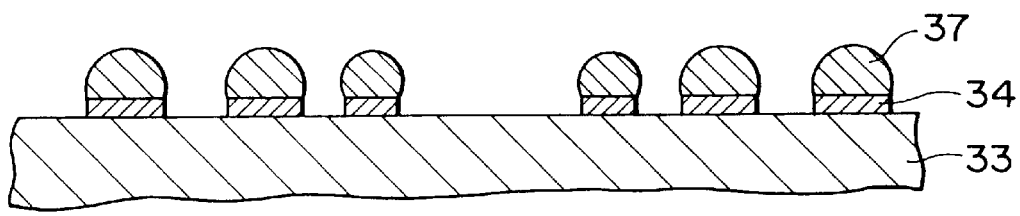
FIG. 4 is a sectional view showing a process of mounting a semiconductor part on a circuit board using a conductive adhesive material in place of bumps according to a further embodiment.

The present invention is not limited to the above-described embodiments but may be variously modified. For example, the formation of bumps can be performed not only by the above-described printing method but also by a coating method, a vapor-deposition method, or a plating method. Even by using either of these methods, bumps each having a desired height can be formed through a mask having a controlled opening diameter. Further, the bumps may be replaced with a conductive adhesive material as needed. For example, as shown in FIG. 4, there may be adopted a method in which land terminals 34 are formed on a circuit board 33 side and a LSI chip is mounted on the circuit board 33 via land terminals on the LSI chip side and a solder cream 37.

Figure 5:
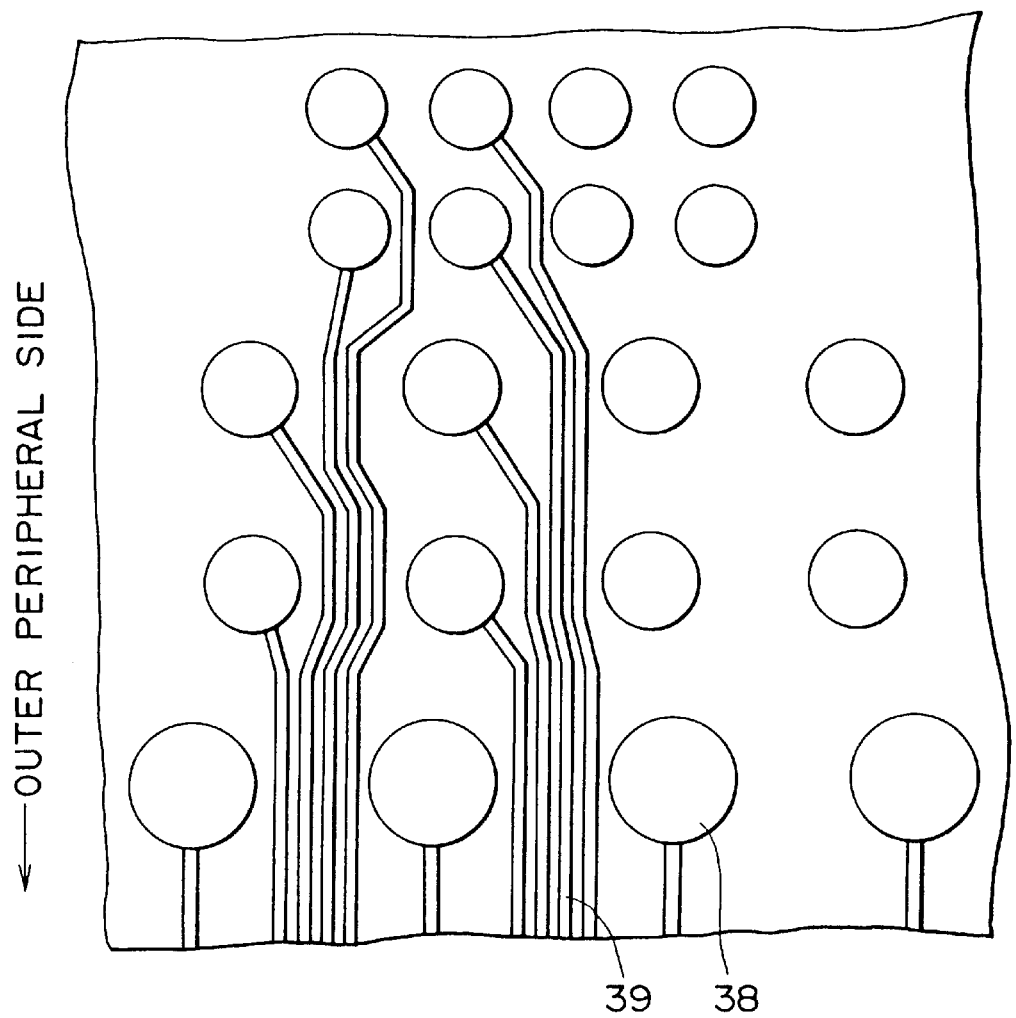
FIG. 5 is a view showing a modification of the present invention in which land terminals of a semiconductor part are arranged with the pitch and diameter thereof irregularly changed.
Figure 6A:
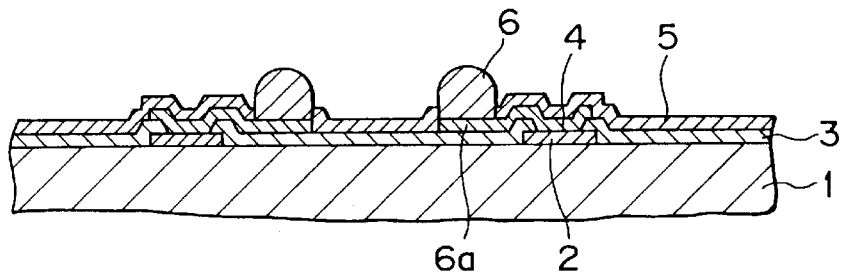
FIGS. 6A to 6D are views showing steps of mounting a semiconductor part on a circuit board in accordance with a related art method.
Figure 6B:
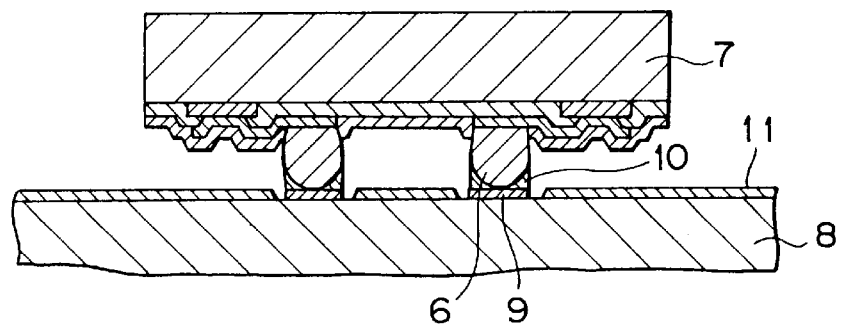
Figure 6C:
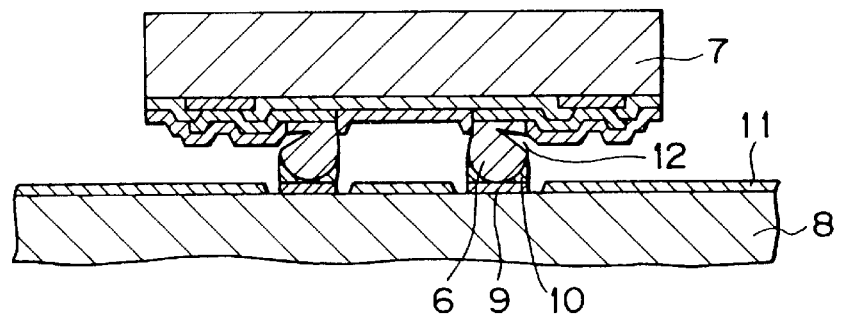
Figure 6D:
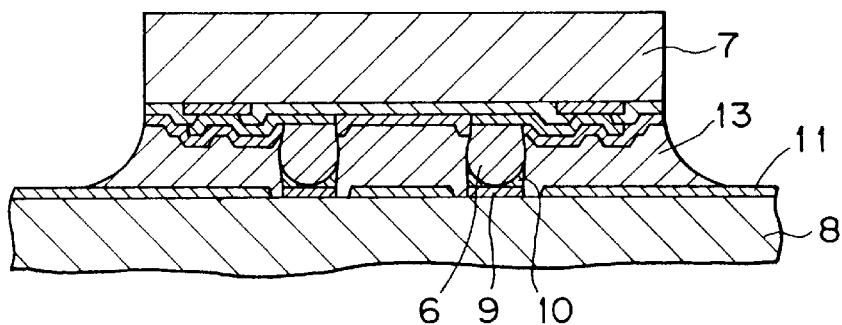
Figure 7B:
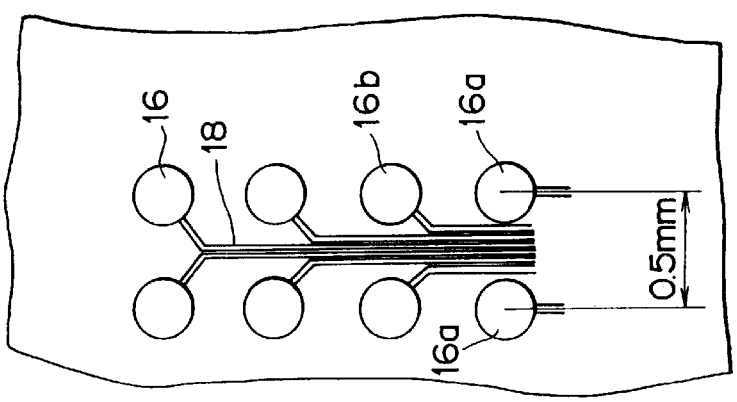
FIGS. 7A and 7B are typical views each showing an array of a semiconductor part or a circuit board in accordance with a related art method.
Figure 7A:
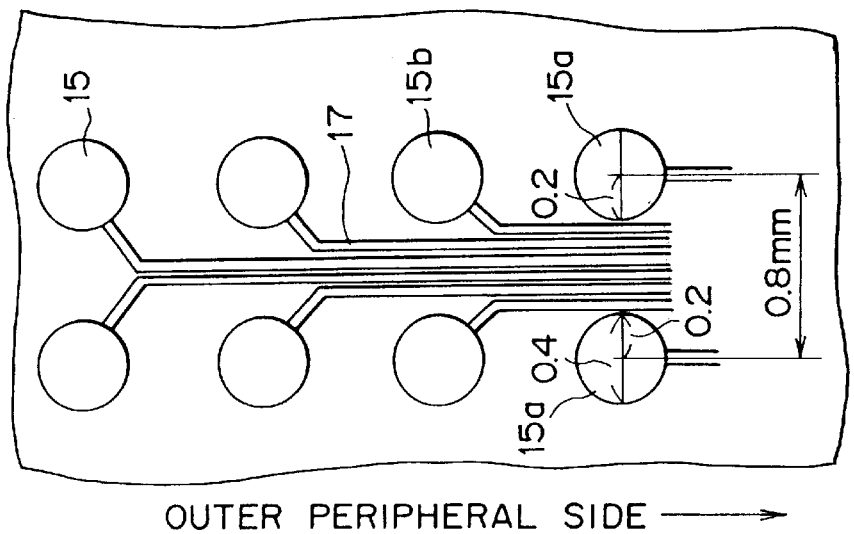

According to the present invention, the array of land terminals is not limited to those described in the above-described embodiments but may be variously modified insofar as it satisfies the specific requirement of the present invention. For example, FIG. 5 shows one modification in which land terminals 38 are arranged on a chip or wafer with the pitch and diameter thereof being irregularly changed. In this figure, reference numeral 39 designates re-arrangement wires. Further, while in the above embodiments both the pitch and diameter of those of the land terminals closer to the outer peripheral portion of the base are specified at larger values, the present invention is not limited thereto. According to the present invention, either the pitch or diameter of those of land terminals closer to the outer peripheral portion of the base may be set at a larger value.

What is claimed is:

1. A semiconductor part comprising:
    land terminals for bumps, arranged in a grid pattern, which are connected to surfaces of electrode pads via re-arrangement wires on a base;
    wherein said land terminals for bumps are classified into outer land terminals arranged on the outer peripheral side of said base and inner land terminals arranged inside said outer land terminals; and
    each of said outer land terminals has a diameter larger than that of each of said inner land terminals.

2. A semiconductor part according to claim 1, wherein conductive bumps are formed on said land terminals for bumps.

3. A structure for mounting a semiconductor part, comprising:
    land terminals provided with bumps, arranged in a grid pattern, which are connected to the surfaces of electrode pads via re-arrangement wires on a base of said semiconductor part, wherein said land terminals provided with bumps are classified into outer land terminals provided with bumps, which are arranged on the outer peripheral side of said base, and inner land terminals provided with bumps, which are arranged inside said outer land terminals, and each of said outer land terminals provided with bumps has a diameter larger than that of each of said inner land terminals provided with bumps; and land terminals formed on a circuit board;

wherein said land terminal provided with bumps on a semiconductor part side are connected to said land terminals on a circuit board side via said bumps.

4. A structure for mounting a semiconductor part according to claim 3, wherein said circuit board is a circuit board in which the land terminals arranged in a grid pattern are connected to the surfaces of electrode pads via re-arrangement wires on a base;

said land terminals are classified into outer land terminals arranged on the outer peripheral side of said base, and inner land terminals arranged inside said outer land terminals; and each of said outer land terminals has a diameter larger than that of each of said inner land terminals.

5. A semiconductor part comprising:

land terminals for bumps, arranged in a grid pattern, which are connected to surfaces of electrode pads via re-arrangement wires on a base;

wherein said land terminals for bumps are classified into outer land terminals arranged on the outer peripheral side of said base, and inner land terminals arranged inside said outer land terminals; and said outer land terminals are arranged with a pitch larger than an arrangement pitch of said inner land terminals.

6. A semiconductor part according to claim 5, wherein conductive bumps are formed on said land terminals for bumps.

7. A structure for mounting a semiconductor part, comprising:

land terminals provided with bumps, arranged in a grid pattern, which are connected to the surfaces of electrode pads via re-arrangement wires on a base of said semiconductor part, wherein said land terminals provided with bumps are classified into outer land terminals provided with bumps, which are arranged on the outer peripheral side of said base, and inner land terminals provided with bumps, which are arranged inside said outer land terminals, and said outer land terminals provided with bumps are arranged with a pitch larger than an arrangement pitch of said inner land terminals provided with bumps; and land terminals formed on a circuit board;

wherein said land terminal provided with bumps on a semiconductor part side are connected to said land terminals on a circuit board side via said bumps.

8. A structure for mounting a semiconductor part according to claim 7, wherein said circuit board is a circuit board in which the land terminals arranged in a grid pattern are connected to the surfaces of electrode pads via re-arrangement wires on a base;

said land terminals are classified into outer land terminals arranged on the outer peripheral side of said base, and inner land terminals arranged inside said outer land terminals; and said outer land terminals are arranged with a pitch larger than an arrangement pitch of said inner land terminals.

9. A semiconductor part comprising:

land terminals for bumps, arranged in a grid pattern, which are connected to surfaces of electrode pads via re-arrangement wires on a base;

wherein said land terminals for bumps are classified into outer land terminals arranged on the outer peripheral side of said base, and inner land terminals arranged inside said outer land terminals; and said outer land terminals, each of which has a diameter larger than that of each of said inner land terminals, are arranged with a pitch larger than an arrangement pitch of said inner land terminals.

10. A semiconductor part according to claim 9, wherein conductive bumps are formed on said land terminals for bumps.

11. A structure for mounting a semiconductor part, comprising:

land terminals provided with bumps, arranged in a grid pattern, which are connected to the surfaces of electrode pads via re-arrangement wires on a base of said semiconductor part, wherein said land terminals provided with bumps are classified into outer land terminals provided with bumps, which are arranged on the outer peripheral side of said base, and inner land terminals provided with bumps, which are arranged inside said outer land terminals, and said outer land terminals provided with bumps, each of which has a diameter larger than that of each of said inner land terminals provided with bumps, are arranged with a pitch larger than an arrangement pitch of said inner land terminals provided with bumps; and land terminals formed on a circuit board;

wherein said land terminal provided with bumps on a semiconductor part side are connected to said land terminals on a circuit board side via said bumps.

12. A structure for mounting a semiconductor part according to claim 11, wherein said circuit board is a circuit board in which the land terminals arranged in a grid pattern are connected to the surfaces of electrode pads via re-arrangement wires on a base;

said land terminals are classified into outer land terminals arranged on the outer peripheral side of said base, and inner land terminals arranged inside said outer land terminals; and said outer land terminals, each of which has a diameter larger than that of each of said inner land terminals, are arranged with a pitch larger than an arrangement pitch of said inner land terminals.

* * * * *